(12) United States Patent
Saito et al.

(10) Patent No.: US 11,960,320 B2
(45) Date of Patent: Apr. 16, 2024

(54) INTERFACE SYSTEM

(71) Applicant: KIOXIA CORPORATION, Tokyo (JP)

(72) Inventors: Toshitada Saito, Yokohama (JP);
Akihisa Fujimoto, Yamato (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/301,669

(22) Filed: Apr. 17, 2023

(65) Prior Publication Data

US 2023/0251682 A1 Aug. 10, 2023

Related U.S. Application Data

(63) Continuation of application No. 17/885,925, filed on Aug. 11, 2022, now Pat. No. 11,656,651, which is a (Continued)

(30) Foreign Application Priority Data

Oct. 20, 2016 (JP) .................................. 2016-206337

(51) Int. Cl.
*H03L 7/07* (2006.01)
*G06F 1/06* (2006.01)
(Continued)

(52) U.S. Cl.
CPC ................. *G06F 1/06* (2013.01); *G06F 1/12* (2013.01); *G06F 13/38* (2013.01);
(Continued)

(58) Field of Classification Search
None
See application file for complete search history.

(56) References Cited

U.S. PATENT DOCUMENTS

| 5,550,489 A | 8/1996 | Raab |
| 6,407,940 B1 | 6/2002 | Aizawa |

(Continued)

FOREIGN PATENT DOCUMENTS

| EP | 2 939 238 A1 | 11/2015 |
| JP | 5717819 B2 | 5/2015 |
| JP | 5814871 82 | 11/2015 |

OTHER PUBLICATIONS

International Search Report dated Dec. 19, 2017, in pCT/IB2017/055411, filed Sep. 8, 2017.
(Continued)

*Primary Examiner* — Cassandra F Cox
(74) *Attorney, Agent, or Firm* — Oblon, McClelland, Maier & Neustadt, L.L.P.

(57) ABSTRACT

According to one embodiment, an interface system includes a receiver, a first clock generator, a second clock generator, and a sampling circuit. The receiver is configured to receive a first clock and serial data from a host. The first clock generator includes a first voltage controlled oscillator (VCO) and is configured to generate a second clock on the basis of the first clock. The second clock generator includes a second voltage controlled oscillator (VCO) and is configured to generate a third clock on the basis of the serial data. The sampling circuit is configured to sample reception data on the basis of the third clock and the serial data.

13 Claims, 13 Drawing Sheets

Related U.S. Application Data continuation of application No. 17/375,054, filed on Jul. 14, 2021, now Pat. No. 11,460,878, which is a continuation of application No. 16/389,340, filed on Apr. 19, 2019, now Pat. No. 11,099,597, which is a continuation of application No. PCT/IB2017/055411, filed on Sep. 8, 2017.

(51) Int. Cl.

| | | |
|---|---|---|
| *G06F 1/12* | (2006.01) | |
| *G06F 13/38* | (2006.01) | |
| *G06F 13/42* | (2006.01) | |
| *H03L 7/00* | (2006.01) | |
| *H03L 7/08* | (2006.01) | |
| *H03L 7/091* | (2006.01) | |
| *H03L 7/099* | (2006.01) | |
| *H04L 7/00* | (2006.01) | |
| *H04L 7/033* | (2006.01) | |
| *H04L 25/08* | (2006.01) | |
| *H04L 25/14* | (2006.01) | |

(52) U.S. Cl.
CPC ............ *G06F 13/4282* (2013.01); *H03L 7/00* (2013.01); *H03L 7/07* (2013.01); *H03L 7/0807* (2013.01); *H03L 7/091* (2013.01); *H03L 7/099* (2013.01); *H04L 7/0004* (2013.01); *H04L 7/033* (2013.01); *H04L 25/085* (2013.01); *H04L 25/14* (2013.01); *H04L 7/0012* (2013.01)

(56) References Cited

U.S. PATENT DOCUMENTS

| | | | |
|---|---|---|---|
| 8,085,893 | B2 | 12/2011 | Werner |
| 9,781,254 | B1 | 10/2017 | Anim-Appiah |
| 11,099,597 | B2 | 8/2021 | Saito |
| 11,460,878 | B2 | 10/2022 | Saito |
| 11,656,651 | B2 * | 5/2023 | Saito .................. H03L 7/07 327/144 |
| 2006/0120496 | A1 | 6/2006 | Okamura |
| 2008/0063129 | A1 | 3/2008 | Voutilainen |
| 2012/0250811 | A1 | 10/2012 | Misek et al. |
| 2012/0254600 | A1 | 10/2012 | Fujimoto |
| 2014/0013062 | A1 | 1/2014 | Matsukawa et al. |
| 2016/0269033 | A1 | 9/2016 | Saito |

OTHER PUBLICATIONS

Written Opinion dated Dec. 19, 2017, in PCT/IB2017/055411, filed Sep. 8, 2017.

* cited by examiner

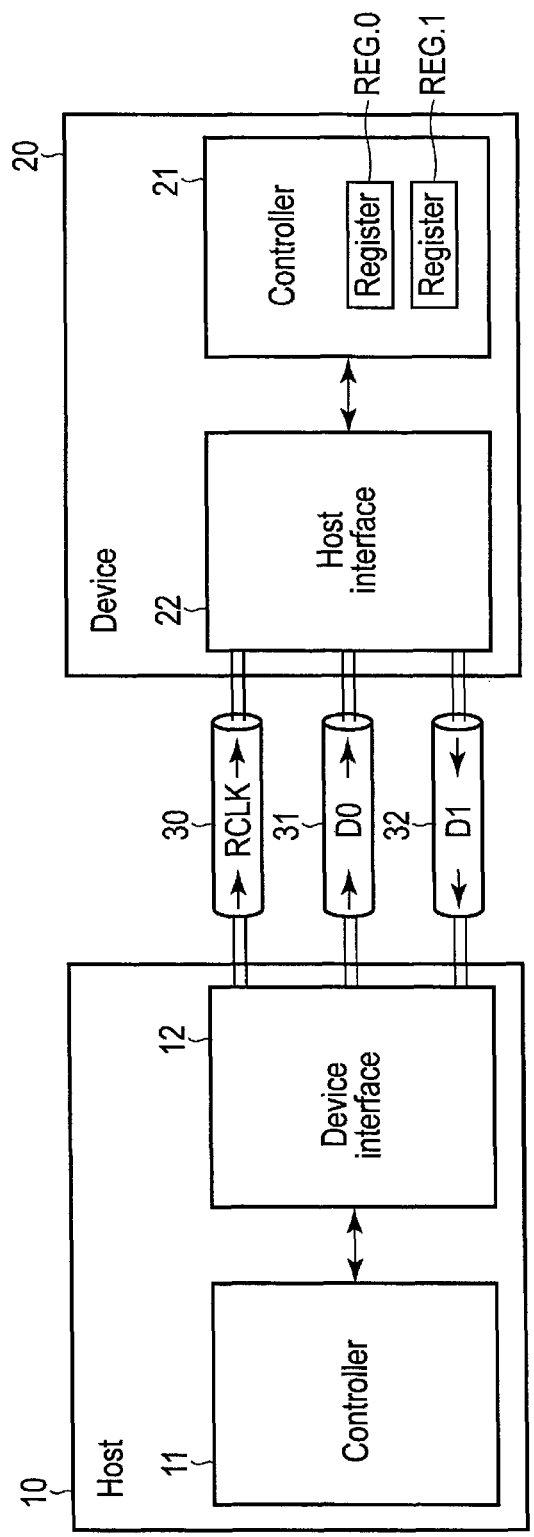
F I G. 1

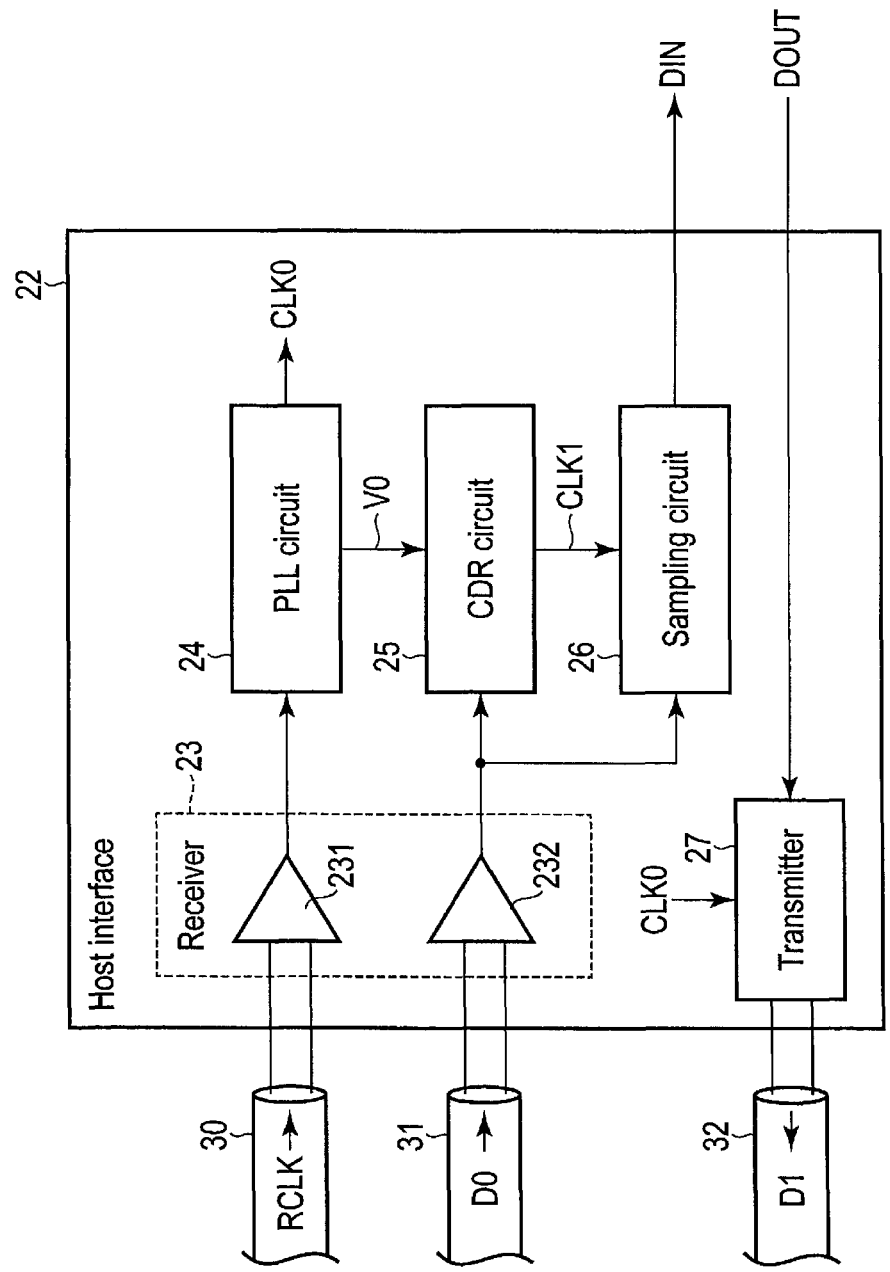
F I G. 2

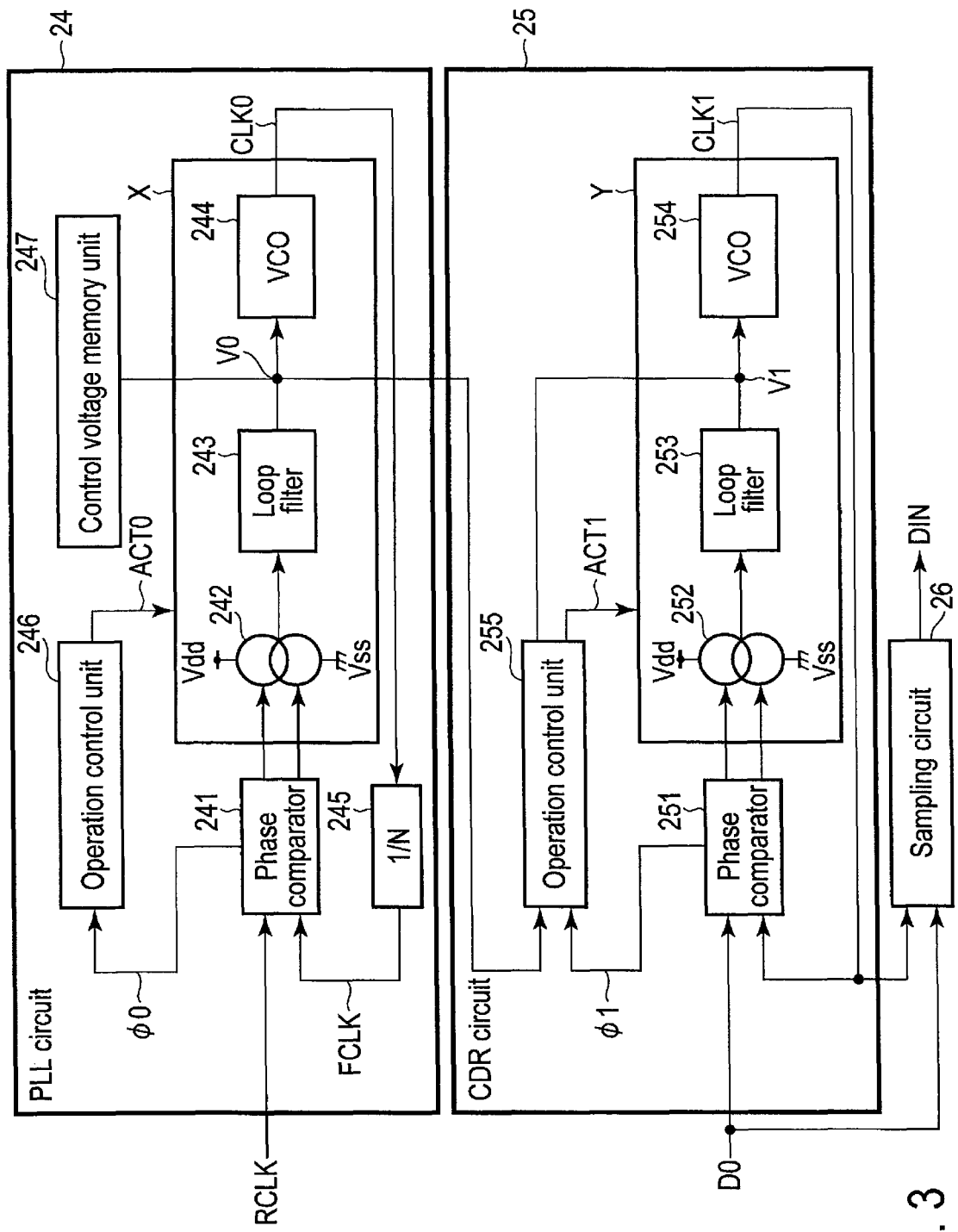
F I G. 3

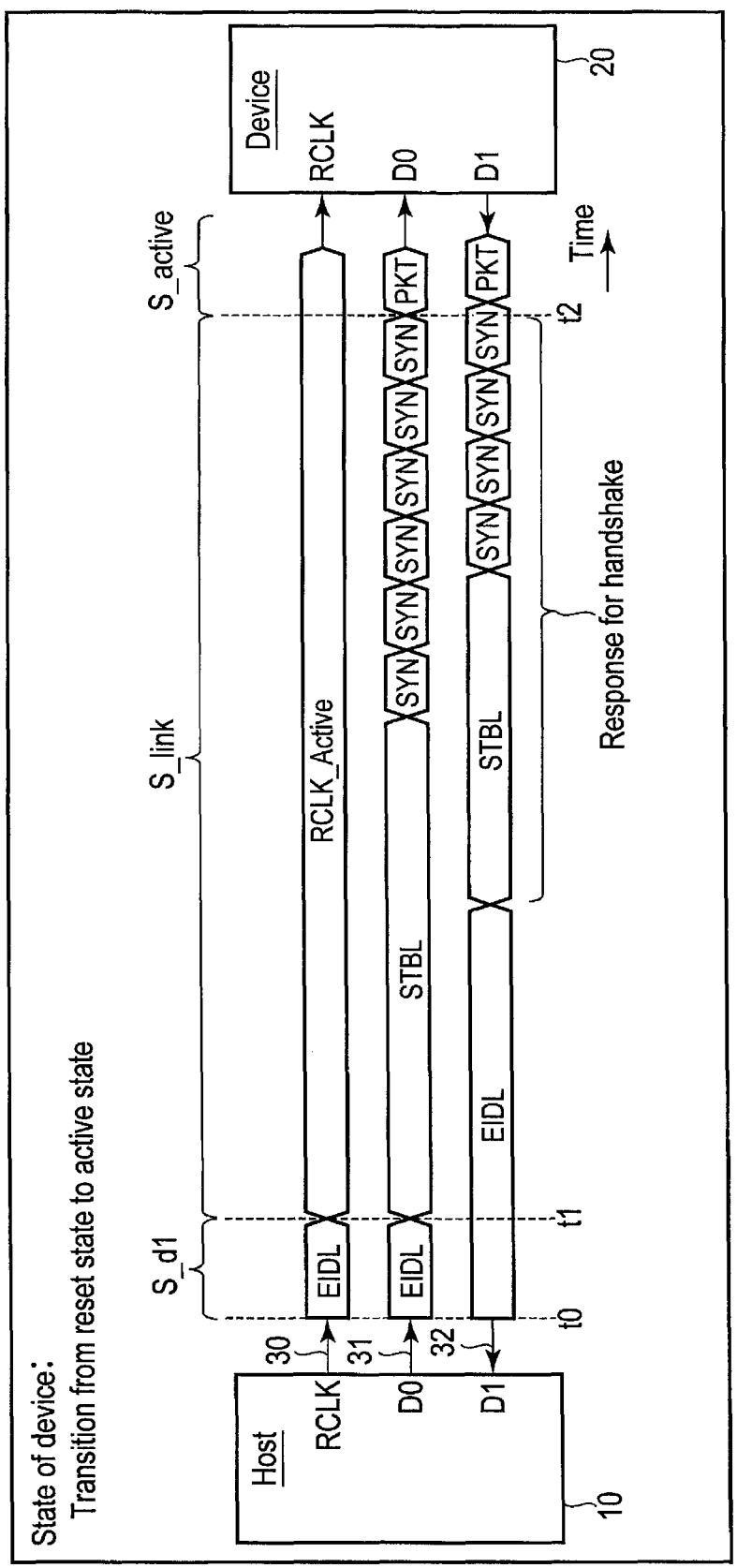
F I G. 8

| State transition of device between active state and dormant state | | Flag QR |
|---|---|---|
| Recovery mode M0 | A' → D' | 01 |
| Recovery mode M1 | A → D | 10 |
| Recovery mode M2 | A → B → C | 11 |

FIG. 9

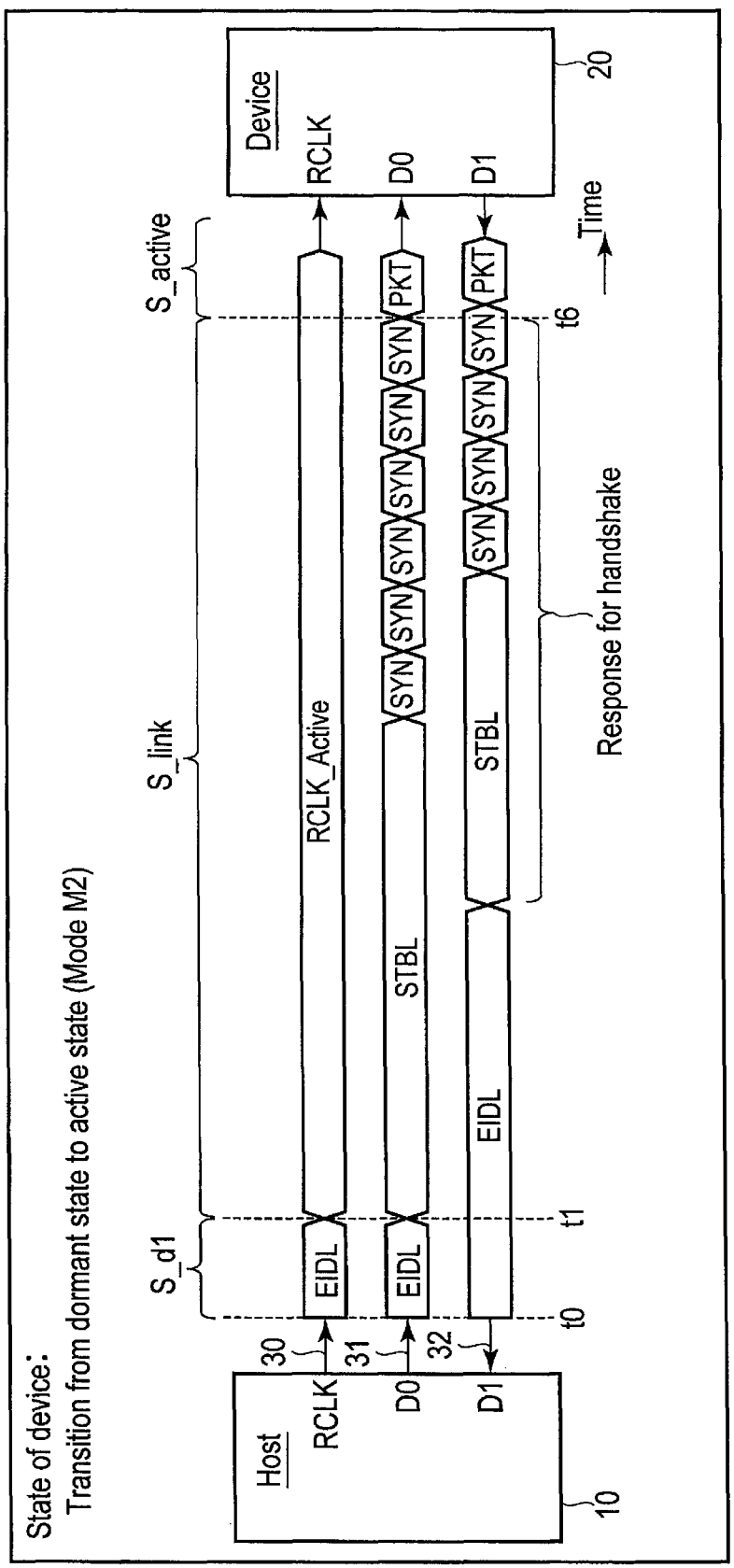
F I G. 14

INTERFACE SYSTEM

CROSS-REFERENCE TO RELATED APPLICATIONS

This application is a continuation of and claims benefit under 35 U.S.C. § 120 to U.S. application Ser. No. 17/885,925, filed on Aug. 11, 2022, which is a continuation of and claims benefit under 35 U.S.C. § 120 to U.S. application Ser. No. 17/375,054 (now U.S. Pat. No. 11,460,878), filed on Jul. 14, 2021, which is a continuation of and claims benefit under 35 U.S.C. § 120 to U.S. application Ser. No. 16/389,340 (now U.S. Pat. No. 11,099,597), filed Apr. 19, 2019, which is a continuation of and claims benefit under 35 U.S.C. § 120 to PCT Application No. PCT/IB2017/055411, filed Sep. 8, 2017, which designates the United States, and is based upon and claims the benefit of priority under 35 U.S.C. § 119 to Japanese Patent Application No. 2016-206337, filed Oct. 20, 2016, the entire contents of each of which are incorporated herein by reference.

FIELD

Embodiments described herein relate generally to an interface system.

BACKGROUND

UHS-II/-III are used as, for example, host interface standards of memory cards, and the UHS-II/-III standardize a high speed transmission interface by a differential serial coupling. On the other hand, memory cards are removable devices and the electrical connection between a memory card and a host is ensured by a physical contact of an electrode of the memory card and an electrode of a socket.

BRIEF DESCRIPTION OF THE DRAWINGS

FIG. 1 is a diagram showing an example of an interface system.

FIG. 2 is a diagram showing an example of a host interface.

FIG. 3 is a diagram showing an example of a PLL circuit and a CDR circuit.

FIG. 8 is a view showing an example of a transition from a reset state to an active state.

FIG. 9 is a view showing an example of a recovery mode when the state transits from a dormant state to an active state.

FIG. 14 is a view showing an example of recovery to an active state in mode M2.

DETAILED DESCRIPTION

Figure 4A:
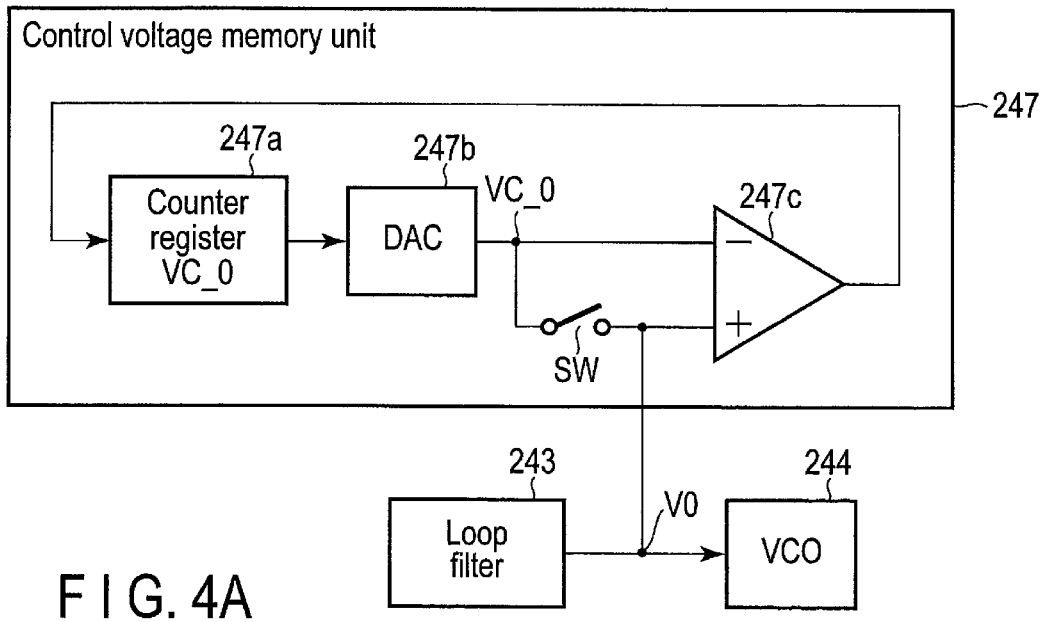
FIG. 4A is a diagram showing an example of a control voltage memory unit.

Various embodiments will be described hereinafter with reference to the accompanying drawings.

In general, according to one embodiment, an interface system connectable to a host comprises a receiver, a first clock generator, a second clock generator, a sampling circuit, and a controller. The receiver is configured to receive a first clock and serial data from the host. The first clock generator includes a first voltage controlled oscillator (VCO) and is configured to generate a second clock on the basis of the first clock. The second clock generator includes a second voltage controlled oscillator (VCO) and is configured to generate a third clock on the basis of the serial data. The sampling circuit is configured to sample reception data on the basis of the third clock and the serial data. The controller is configured to control a first state where the first and second clock generators are in an operating state and a second state where the first and second clock generators are in a non-operating state. The first clock and the serial data are supplied to the receiver in the first state and are not supplied to the receiver in the second state. The controller is further configured to, in a first recovery mode, start sampling of the reception data or transmitting of transmission data to the host after a certain period of time after confirming a transition from the second state to the first state, and not transmit a response indicative of establishment of synchronization of the second and third clocks to the host.

(Embodiment)

FIG. 1 shows an example of an interface system.

A host 10 includes a controller 11, and a device interface 12 controlled by the controller 11. A device 20 includes a controller 21 and a host interface 22 controlled by the controller 21.

The device 20 is a removable device such as a memory card. Since the device 20 is a removable device, the electrical connection between the host 10 and the device 20 is ensured by a physical contact. Thus, the device 20 is not suited for high frequency transmission and the contact state between the host 10 and the device 20 tends to be unstable.

Thus, for example, in UHS-II/-III standards as interface standards, the device interface 12 and the host interface 22 include reference clock transmission line 30 and data transmission lines 31 and 32. Each of the transmission lines 30, 31, and 32 includes signal line pair (lane+ and lane−) for transmitting differential signals.

Then, the host 10 supplies a reference clock RCLK to the device 20 through the reference clock transmission line 30 in parallel to the transfer of serial data D0 and D1 through the data transmission lines 31 and 32. The reference clock RCLK is a low speed (low frequency) clock, and the device 20 generates a high frequency inner clock in order to perform high speed data transmitting and receiving on the basis of the reference clock RCLK.

As explained above, in UHS-II/-III standards, the device 20 generates the inner clock on the basis of the reference clock RCLK, and thus, electro-magnetic interference (EMI) is decreased, and data transfer of the transmission/reception data can be efficient.

However, for example, in UHS-II standard, the frequency of the reference clock RCLK is defined as 1/15 or 1/30 of the data transmission rate (frequency), and in UHS-III standard, the frequency of the reference clock RCLK is defined as 1/60 or 1/120 of the data transmission rate.

Thus, for example, when the device 20 is changed to an active state from a reset state or a dormant state, if the inner clock is generated on the basis of such a low frequency reference clock RCLK, a time required for the stabilization of the frequency of the inner clock after the reception of the reference clock RCLK, that is, a time required until output frequency of a phase-locked loop (PLL) circuit is locked after the reception of the reference clock RCLK becomes longer, and the time cannot be steady (varies greatly).

Note that, the reset state of the device 20 is a state where the device 20 is physically disconnected from the host 10, that is, a state where a memory card is taken out of a socket.

Furthermore, the dormant state of the device 20 is a state where the device 20 is physically connected to the host 10, that is, a state where a memory card is inserted in a socket while the device 20 enters a power saving mode (a state where the data transfer of transmission/reception data is not possible).

Furthermore, the active state of the device 20 is a state where the device 20 is physically connected to the host 10, that is, a state where a memory card is inserted in a socket and the device 20 enters a normal operation mode (a state where the data transfer of transmission/reception data is possible.

In that case, in order to start the data transfer of the transmission/reception data between the host 10 and the device 20, the host 10 must confirm the completion of preparation of the data transfer of the transmission/reception data in the device 20, that is, the host 10 must confirm that the frequency of the inner clock is stabilized. The stabilization of the frequency of the inner clock, that is, the output frequency of the PLL circuit being locked will be referred to as that synchronization of the inner clock is established. Furthermore, confirmation of the establishment of the synchronization of the inner clock will be referred to as a handshake check (or link check) between the host 10 and the device 20.

In order to perform a handshake check between the host 10 and the device 20, the device 20 is required to use, for example, a data transmission line 32 to transmit to the host 10 a response indicating that the synchronization of the inner clock is established. As a result, a longer time is required to perform the handshake, and latency in the data transfer increases.

On the other hand, in UHS-II standard, a specification referred to as a low power mode exists. In this specification, for example, since a reference clock RCLK is supplied from the host 10 to the device 20 even in a dormant state, the inner clock is constantly stabilized.

Thus, for example, in a case where the device 20 is changed to an active state from a dormant state, when a certain period of time elapses since a transition from the dormant state to the active state is instructed, the data transfer of transmission/reception data can be performed between the host 10 and the device 20 without performing a handshake check. The certain period of time is, as compared to a time required to perform the data transfer of the transmission/reception data when the supply of the reference clock RCLK is stopped in the dormant state, very short. That is, the latency in the data transfer can be reduced.

However, in this low power mode, for example, the PLL circuit configured to generate the inner clock must be in an operating state even if the device 20 is in a dormant state. Thus, the power consumption of the device 20 in a dormant state increases.

In consideration of this point, in the following embodiment, a mode where the supply of the reference clock RCLK is stopped when the device 20 enters in a dormant state and a handshake check between the host 10 and the device 20 is omitted when the device 20 returns to an active state is added in order to propose an interface system in which standby power in a dormant state is small and a rapid recovery to an active state from a dormant state is performable.

Note that first and second resistors REG. 0 and REG. 1 in the controller 12 will be explained below with reference to FIG. 2.

FIG. 2 shows an example of a host interface.

The transmission lines 30, 31, and 32 conform to, for example, high speed serial interface standards such as UHS-II/-III. In these standards, for example, a reference clock RCLK is input to the host interface 22 through the reference clock transmission line 30. Furthermore, serial data D0 are input to the host interface 22 through the data transmission line 31, and serial data D1 are input to the host through the data transmission line 32.

The host interface 22 includes, for example, a receiver 23, PLL circuit (clock generator) 24, clock data recovery (CDR) circuit (clock generator) 25, sampling circuit 26, and transmitter 27.

The receiver 23 includes differential amplifiers 231 and 232. The differential amplifier 231 functions as an input buffer of the reference clock RCLK and the differential amplifier 232 functions as an input buffer of serial data D0.

The differential amplifier 231 converts the reference clock RCLK as a differential signal into a single end signal and outputs the single end signal to the PLL circuit 24. The differential amplifier 232 converts serial data D0 as a differential signal into a single end signal and outputs the single end signal to the CDR circuit 25 and the sampling circuit 26.

The PLL circuit 24 generates an inner clock CLK0 on the basis of the reference clock RCLK. The inner clock CLK0 is output to, for example, a transmitter 27. The transmitter 27 outputs transmission data DOUT to the data transmission line 32 as serial data D1 on the basis of the inner clock CLK0.

Furthermore, the PLL circuit 24 includes a voltage controlled oscillator (VCO). The VCO is controlled by a control voltage V0. In this example, the control voltage V0 is output to the CDR circuit 25, too.

The CDR circuit 25 generates an inner clock CLK1 on the basis of serial data D0. The CDR circuit 25 also functions as a PLL circuit. The inner clock CLK1 is output to, for example, the sampling circuit 26. The sampling circuit 26 extracts reception data DIN from the serial data D0 on the basis of the inner clock CLK1. The inner clock CLK1 is generated not from the reference clock RCLK but from serial data D0 in order to perform high speed data receiving.

For example, the PILL circuit 24 and the CDR circuit 25 can change to a standby state where inner clocks CLK0 and CLK1 are not output while the device is in the power saving mode. With the PLL circuit 24 and the CDR circuit 25 in the standby state, the power consumption in a period of time when the data transfer of transmission/reception data between the host and the device is not performed can be reduced. This point will be described later.

Here, registers REG. 0 and REG. 1 of FIG. 1 will be explained.

For example, register REG. 0 is referred to as device capabilities register, and register REG. 1 is referred to as device setting register.

The register REG. 0 stores, for example, parameters which can operate PLL circuit 24 and CDR circuit 25 of FIG. 2.

For example, a period of time T_EIDL_RECOVERY required for synchronization of the inner clock CLK1 is stored in the register REG. 0. The period of time is defined by, for example, a length of STBL signals, or if a length of STBL signals is constant, the number of STBL signals (the number of symbols). The register REG. 0 may store a period of time of EIDL signals between STBH signals and STBL signals or the number of symbols of the EIDL signals.

Furthermore, the register REG. 1 stores, for example, parameters required to operate PLL circuit 24 and CDR circuit 25 of FIG. 2. For example, these parameters (values of N_EIDL_RECOVERY_GAP, T_EIDL_RECOVERY, T_EIDL_GAP, etc.,) change depending on frequency ranges of PLL circuit 24 and CDR circuit 25 of FIG. 2.

The controller 21 of FIG. 1 controls the host interface 22 on the basis of the parameters (a period of time required for the synchronisation of inner clocks CLK0 and CLK1) stored in the registers REG. 0 and REG. 1.

FIG. 3 shows an example of a PLL circuit and a CDR circuit.

The PLL circuit 24 includes a phase comparator 241, charge pump circuit 242, loop filter 243, voltage controlled oscillator (VCO) 244, divider 245, operation control unit 246, and control voltage memory unit 247.

The phase comparator 241 compares a phase of the reference clock RCLK to a phase of a feedback clock FCLK from the divider 245. The phase comparator 241 outputs control signals (up signals and down signals) corresponding to a phase difference of these clocks.

For example, if frequency of the reference clock RCLK is higher than frequency of the feedback clock FCLK, the phase comparator 241 outputs up signals to increase the frequency of the feedback clock FCLK. Furthermore, if frequency of the reference clock RCLK is lower than frequency of the feedback clock FCLK, the phase comparator 241 outputs down signals to decrease the frequency of the feedback clock FCLK.

The charge pump circuit 242 converts the control signals (up signals and down signals) from the phase comparator 241 into a charge pump current (analog signals) and outputs the charge pump current to the loop filter 243. The loop filter 243 converts the charge pump current into a control voltage V0. The voltage controlled oscillator (VCO) 244 outputs the inner clock CLK0 on the basis of the control voltage VU. The divider 245 outputs the feedback clock FOLK having 1/N frequency of the frequency of the inner clock CLK0.

That is, the PLL circuit 24 generates the inner clock CLK0 having N-fold frequency of the frequency of the reference clock RCLK. Note that N is a natural number of 1 or more. Furthermore, N may be selected from a plurality of values in accordance with the data transmission rate of the transmission/reception data.

Furthermore, if frequency of the inner clock CLK0 is lower than N-fold of the frequency of the reference clock RCLK, the frequency of the reference clock RCLK becomes higher than the frequency of the feedback clock FCLK. Thus, the phase comparator 241 outputs us signals and the voltage controlled oscillator (VCO) 244 increases the frequency of the inner clock CLK0.

On the other hand, if the frequency of the inner clock CLK0 is greater than N-fold of the frequency of the reference clock RCLK, the frequency of the reference clock RCLK becomes lower than the frequency of the feedback clock FOLK. Thus, the phase comparator 241 outputs down signals, and the voltage controlled oscillator (VCO) 244 decreases the frequency of the inner clock CLK0.

Through the above control, the frequency of the inner clock CLK0 is, eventually, locked to N-fold of the frequency of the reference clock RCLK. Such a state where the frequency of the inner clock CLK0 is locked is a state where the synchronization of the inner clock CLK0 is established and the data transfer of the transmission/reception data becomes possible between the host and the device.

The operation control unit 246 changes the PLL circuit 24, for example, to a standby state from an operating state when the device is in a power saving mode. Note that, the PLL circuit 24 may be maintained in an operating state even when the device is in a power saving mode. Here, the operating state is a state where the inner clock CLK0 can be output and the standby state is a state where the inner clock CLK0 is not output.

In this example, the operation control unit 246 changes, in a standby state, the charge pump circuit 242, loop filter 243, voltage controlled oscillator (VCO) 244, and divider 245 which are surrounded by an area X to a non-operating state, respectively. Thus, in a period of time when the data transfer of the transmission/reception data between the host and the device is not performed, the power consumption of the interface system can be reduced.

The phase comparator 241 is, for example, constantly in an operating state while the device is physically connected to the host. Thus, the operation control unit 246 can control the operation of the charge pump circuit 242, loop filter 243, voltage controlled oscillator (VCO) 244, and divider 245 on the basis of control signals φ0 from the phase comparator 241.

For example, if control signals φ0 indicate that the reference clock RCLK is not input, the operation control unit 246 changes the charge pump circuit 242, loop filter 243, voltage controlled oscillator (VCO) 244, and divider 245 to a non-operating state. Furthermore, if control signals φ0 indicate that the reference clock RCLK is input, the operation control unit 246 changes the charge pump circuit 242, loop filter 243, voltage controlled oscillator (VCO) 244, and divider 245 to an operating state.

The control voltage memory unit 247 stores a control voltage V0 input in the voltage controlled oscillator (VCO) 244 in a lock state when the frequency of the inner clock CLK0 is locked, that is, when the synchronization of the inner clock CLK0 is established. The stored control voltage V0 is used, when the device enters a power saving mode and then recovers to a normal operation mode from the power saving mode, to lock the frequency of the inner clock CLK0 to rapid.

That is, before and after the power saving mode, there will be no change in the data transmission rate (range) of the transmission/reception data. In that case, in the normal operation mode after the power saving mode, the control voltage V0 by which the frequency or the inner clock CLK as locked would match to the control voltage VU by which the frequency of the inner clock CLK had be locked in the normal operation mode before the power saving mode, or to an approximate value thereof.

Thus, in a case of the recovery to the normal operation mode from the power saving mode, if the control voltage V0 by which the frequency of the inner clock CLK is locked in the normal operation mode before the power saving mode is used for an initial control voltage of the voltage controlled oscillator (VCO) 244 (the initial control voltage when the voltage controlled oscillator 244 changes to the operating state), the frequency of the inner clock CLK0 can be locked rapidly as compared to, for example, a case where the initial control voltage of the voltage controlled oscillator 244 is 0V.

Note that the above can be achieved only if there is not a change in the data transmission rate (range) of the transmission/reception data as in the case of the recovery from the power saving mode to the normal operation mode.

That is, in the interface system, there is a mode where the data transmission rate of the transmission/reception data is changed. In such a case, an algorithm for rapidly locking the output frequency of the voltage controlled oscillator (VCO) 244 after the change of the data transmission rate by using the control voltage V0 of the voltage controlled oscillator (VCO) 244 before the change of the data transmission rate does not adopted.

The CDR circuit 25 includes a phase comparator 251, charge pump circuit 252, loop filter 253, voltage controlled oscillator (VCO) 254, and operation control unit 255.

The phase comparator 251 compares a phase of the serial data D0 to a phase of an inner clock (feedback clock) CLK1 from the voltage controlled oscillator (VCO) 254. The phase comparator 251 outputs control signals (up signals and down signals) corresponding to a phase difference of these clocks.

For example, if frequency of the serial data D0 is higher than frequency of the inner clock CLK1, the phase comparator 251 outputs up signals to increase the frequency of the inner clock CLK1. Furthermore, if frequency of the serial data D0 is lower than frequency of the inner lock CLK1, the phase comparator 251 outputs down signals to decrease the frequency of the inner clock CLK1.

The charge pump circuit 252 converts the control signals (up signals and down signals) from the phase comparator 251 into a charge pump current (analog signals) and outputs the charge pump current to the loop filter 253. The loop filter 253 converts the charge pump current into a control voltage V1. The voltage controlled oscillator (VCO) 254 outputs the inner clock CLK1 on the basis of the control voltage V1. That is, the CDR circuit 25 generates the inner clock CLK1 synchronized with serial data D0.

Furthermore, if frequency of the inner clock CLK1 is lower than the frequency of serial data D0 (if frequency of serial data D0 is greater than frequency of the inner clock CLK1), the phase comparator 251 outputs up signals and the voltage controlled oscillator (VCO) 254 increases the frequency of the inner clock CLK1.

On the other hand, if the frequency of the inner clock CLK1 is greater than the frequency of serial data D0 (if frequency of serial data D0 is less than frequency of the inner clock CLK1), the phase comparator 251 outputs down signals and the voltage controlled oscillator (VCO) 254 decreases the frequency of the inner clock CLK1.

Through the above control, the frequency of the inner clock CLK1 is, eventually, locked to the frequency of serial data D0. Such a state where the frequency of the inner clock CLK1 is locked is a state where the synchronization of the inner clock CLK1 is established and the data transfer of the transmission/reception data becomes possible between the host and the device.

The operation control unit 255 changes, for example, the CDR circuit 25 into a standby state from an operating state when the device is in a power saving mode. Note that, the CDR circuit 25 may be maintained in an operating state even when the device is in a power saving mode.

In this example, the operation control unit 255 changes, in a standby state, the charge pump circuit 252, loop filter 253, and voltage controlled oscillator (VCO) 254 which are surrounded by an area Y to a non-operating state, respectively. Thus, in a period of time when the data transfer of the transmission/reception data between the host and the device is not performed, the power consumption of the interface system can be reduced.

The phase comparator 251 is, for example, constantly in an operating state while the device is physically connected to the host. Thus, the operation control unit 255 can control the operation of the charge pump circuit 252, loop filter 253, and voltage controlled oscillator (VCO) 254 on the basis of control signals φ1 from the phase comparator 251.

For example, if control signals (pi indicate that serial data D0 are not input, the operation control unit 255 changes the charge pump circuit 252, loop filter 253, and voltage controlled oscillator (VCO) 254 to a non-operating state. Furthermore, if control signals φ1 indicate that serial data D0 are input, the operation control unit 255 changes the charge pump circuit 252, loop filter 253, and voltage controlled oscillator (VCO) 254 to an operating state.

The operation control unit 255 supplies, when the voltage controlled oscillator (VCO) 254 is operated, the control voltage VU of the PLL circuit 24 to the voltage controlled oscillator (VCO) 254 as an initial control voltage (control voltage at a time when the voltage controlled oscillator (VCO) 254 changes in an operating state).

Thus, in a case of the recovery to the normal operation mode from the power saving mode, the initial control voltage of the voltage controlled oscillator (VCO) 254 becomes the control voltage V0 of the voltage controlled oscillator 244 in the PLL circuit 24, or the initial control voltage from the control voltage memory unit 247, and thus, the frequency of the inner clock CLK1 can be locked rapidly as compared to, for example, a case where the initial control voltage of the voltage controlled oscillator (VCO) 254 is 0V.

FIG. 4A is a diagram showing an example of the control voltage memory unit 247.

The control voltage memory unit 247 includes a counter register 247a, digital-analog converter (DAC) 247b, differential amplifier (comparator) 247c, and switch element SW.

The counter register 247a stores initial control voltage (digital value) VC_0 of the voltage controlled oscillator (VCO) 244. The initial control voltage VCO is stored as a default value when the device is shipped. Furthermore, when the data transfer of transmission/reception data is performed between a host and a device, the counter register 247a stores, in a normal operation mode immediately before the current time point, the control voltage of the locked voltage controlled oscillator (VCO) 244 stored therein as an initial control voltage VCO.

For example, upon changing from power saving mode to a normal operation mode, the switch element SW is turned on. Furthermore, the initial control voltage (digital value) VCO stored in the counter register 247a is converted into an analog value by the digital-analog converter (DAC) 247b, and is supplied to the voltage controlled oscillator (VCO) 244 as a control voltage V0.

As a result, a period of time required to lock the output frequency of the voltage controlled oscillator (VCO) 244, that is, a lockup time until the synchronization of the inner clock CLK0 is established is shortened significantly. Furthermore, the lockup time is steady. That is, for example, the synchronization of the inner clock CLK0 is securely established within a certain period of time after the confirmation of the device entering a normal operation mode from a power saving mode.

The switch element SW is turned off after supplying the initial control voltage VC_0 to the voltage controlled oscillator (VCO) 244. The timing for turning off the switch element SW may be any one of timings after the supply of the initial control voltage VC_0 to the voltage controlled oscillator (VCO) 244. For example, the switch element SW may be turned off before the above certain period of time when the synchronization of the inner clock CLK0 is securely established or thereafter.

When the switch element SW is turned off, the control voltage V0 from the loop filter 243 is, for example, input to a positive input terminal of the differential amplifier 247*c*. Furthermore, the initial control voltage VC_0 stored in the counter register 247*a* is, for example, input in a negative input terminal of the differential amplifier 247*c* through the digital-analog converter (DAC) 247*b*.

Figure 4B:
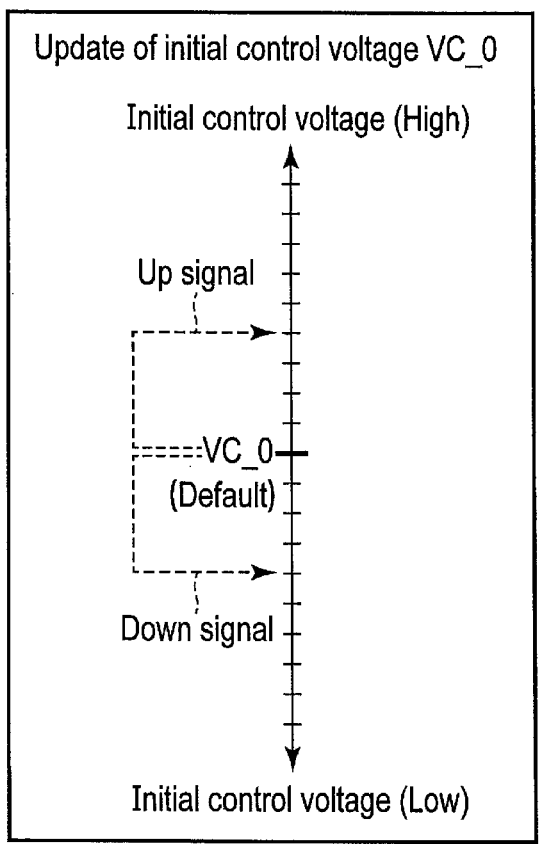
FIG. 4B is a view showing an example of update of an initial control voltage of a VCO.

As shown in FIG. 4B, if the control voltage V0 is greater than the initial control voltage VC_0, the differential amplifier 247*c* outputs up signals (+). The value of the up signals becomes greater in proportion to a difference between the initial control voltage VC_0 and the control voltage V0. The counter register 247*a* updates the initial control voltage VC_0 in accordance with the value of the up signals, that is, the initial control voltage VC_0 is increased by the number of steps corresponding to the value of the up signals.

Furthermore, as shown in FIG. 4B, if the initial control voltage VC_0 is Greater than the control voltage V0, the differential amplifier 247*c* outputs down signals (−). The value of the down signals becomes greater in proportion to a difference between the initial control voltage VC_0 and the control voltage V0. The counter register 247*a* updates the initial control voltage VC_0 in accordance with the value of the down signals, that is, the initial control voltage VC_0 is decreased by the number of steps corresponding to the value of the down signals.

The above operation is repeated, and thereby a voltage output from the digital-analog converter (DAC) 247*b* follows the control voltage V0 from the loop filter 243, Eventually, the control voltage V0 from the loop filter 243 when the frequency, of the inner clock CLK0 (output frequency) is locked is stored in the counter register 247*a* as an updated initial control voltage VC_0.

Note that, in this example, the number of steps of up/down signals is in proportion to a difference between VC_0 and V0; however, the differential amplifier 247*c* may be operated as a comparator, and thereby VC_0 may be changed step-by-step. In that case, the value of VC_0 stored in the counter register 247*a* changes one step at a time corresponding to up/down signals (±1) from the differential amplifier 247*c*. Through such a process, the voltage output from the digital-analog converter (DAC) 247*b* follows the control voltage V0 from the loop filter 243.

With the control voltage memory unit 247 as above, the value of the initial control voltage VC_0 stored in the counter register 247*a* is updated following the control voltage V0 from the loop filter 243. With such a system, the present embodiment can be applied to a plurality of interface systems having reference clocks RCLK of difference frequencies. That is, if the initial control voltage VC_0 is a fixed value or is selected from a plurality of fixed values, such a case is difficult to be applied to a system an which frequency or the reference clock RCLK is an arbitrary value.

Note that the initial control voltage VC_0 may be stored in a memory circuit which is different from the counter register 247*a*, that is, volatile RAMs such as SRAM and DRAM, non-volatile RAMs such as MRAM, or latch circuit. Furthermore, the initial control voltage VC_0 may be stored as a digital value or an analog value.

As can be understood from the above, with the embodiment shown in FIGS. 2 to 4, in a case where the data transmission rate (range) of the transfer/reception data is not changed as before and after a power saving mode, an initial control voltage of the voltage controlled oscillator (VCO) 244 in the PLL circuit 24 is a lock voltage VC_0 (control voltage at a time when the output frequency of the voltage controlled oscillator 244 is locked) stored in the control voltage memory unit 247. The lock voltage VC_0 stored in the control voltage memory unit 247 is a lock voltage which is used before the power saving mode. Furthermore, an initial control voltage of the voltage controlled oscillator (VCO) 254 in the CDR circuit 25 is a control voltage V0 of the voltage controlled oscillator (VCO) 244 in the PLL circuit 24 or the lock voltage VC_0 from the control voltage memory unit 247.

Figure 5:
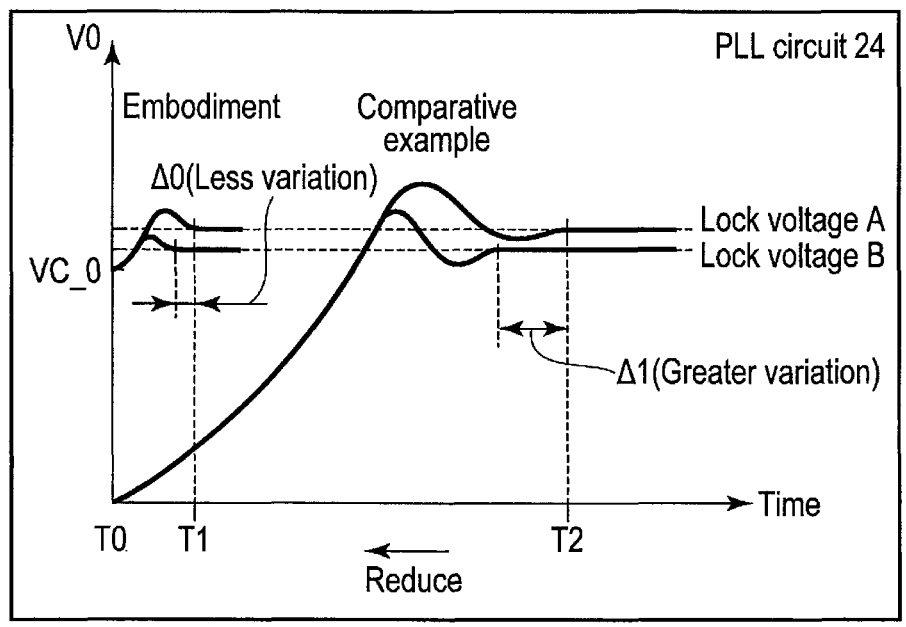
FIG. 5 is a view showing characteristics of the PLL circuit.

Thus, in the embodiment, for example, as shown in FIG. 5, a period of time required to lock the output frequency of the PLL circuit 24, that is, a lockup time until the synchronization of the inner clock CLK0 is established (an example T0 to T1) is reduced significantly as compared to a comparative example T0 to T2. Furthermore, if a lock voltage B after the power saving mode is difference from a lock voltage A before the power saving mode, a variety Δ0 of lockup time in the embodiment is less than a variety, Δ1 of lockup time in the comparative example. This means that, in the embodiment, the lockup time of the PLL circuit 24 is quick and steady.

Thus, as will be described later, a new mode in which the supply of the reference clock RCLK is stopped when the device changes into a dormant state and a handshake between the host and the device is omitted in a case where the device returns to an active state can be added. That is, since the lockup time of the PLL circuit 24 is quick and steady, when the device returns to an active state, the data transfer of transmission/reception data can be performed immediately after a certain period of time after reverting to the active state.

Figure 6:
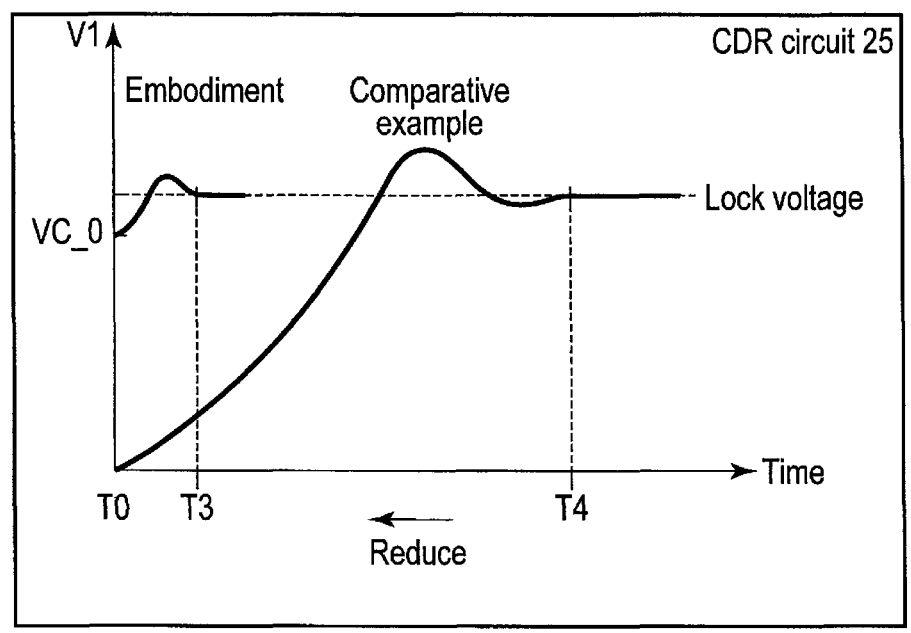
FIG. 6 is a view showing characteristics of a CDR circuit.

Furthermore, in the embodiment, for example, as shown in FIG. 6, a period of time required to lock the output frequency of the CDR circuit 25, that is, a lockup time until the synchronization of the inner clock CLK1 is established (an example T0 to T3) is reduced significantly as compared to a comparative example T0 to T4.

Therefore, an interface system of less standby power and rapid recovery can be achieved.

Figure 7:
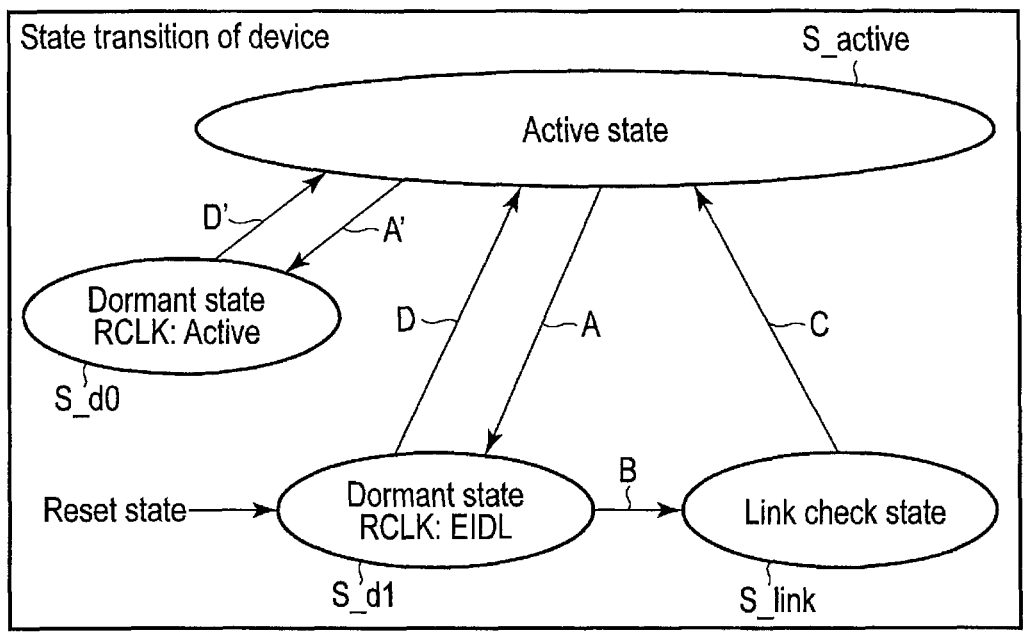
FIG. 7 is a view showing a state transition of a device.

FIG. 7 shows a state transition of a device.

The stat transition of a T device is controlled or managed by the controller 21 of FIG. 1.

Reset state, dormant state, and active state are as explained with reference to FIG. 1 and thus, the explanation here will be omitted. A link check state is a state where the synchronization of the inner clock CLK0 generated by the PLL circuit 24 and the synchronization of the inner clock CLK1 generated by the CDR circuit 25 of FIGS. 1 to 6 are checked whether or not they are established.

In this example, there are two types of dormant state.

A dormant state S_d0 is, for example, a state where, in a power saving mode, the PLL circuit 24 generates an inner clock CLK0 and the CDR circuit 25 does not generate an inner clock CLK1. That is, in the dormant state S_d0, the reference clock RCLK is supplied to the device form the host and the reference clock transmission line 30 of FIGS. 1 and 2 is in an active state.

For example, in the dormant state S_d0, the DLL circuit 24 of FIG. 3 is in an operating state while the CDR circuit 25 of FIG. 3 is substantially in a non-operating state. That is, in the CDR circuit 25 in the dormant state S_d0, the phase comparator 251 is in an operating state while the charge pump circuit 252, loop filter 253, and voltage controlled oscillator (VCO) 254 in the area Y are in a non-operating state. Furthermore, serial data D0 are not supplied from the host to the device, and the data transmission line 31 of FIGS. 1 and 2 is in a non-active state.

A dormant state S_d1 is, for example, a state where, in a power saving mode, the DLL circuit 24 does not generate an inner clock CLK0 and the CDR circuit 25 does not Generate an inner clock CLK1. That is, in the dormant state S_d1, the reference clock RCLK and serial data D0 are not supplied to the device from the host, and the reference clock transmission line 30 and data transmission line 31 of FIGS. 1 and 2 are in a non-active state (electric idle: EIDL).

For example, in the dormant state S_d1, the DLL circuit 24 and the CDR circuit 25 of FIG. 3 are both substantially, in a non-operating state. That is, in the DLL circuit 24 in the dormant state S_d1, the phase comparator 241 is in an operating state while the charge pump circuit 242, loop filter 243, and voltage controlled oscillator (OR-20) 244 in the area X are in a non-operating state. Furthermore, in the CDR circuit in the dormant state S_d1, the phase comparator 251 is in an operating state while the charge pump circuit. 252, loop filter 253, and voltage controlled oscillator (VCO) 254 in the area Y are in a non-operating state.

[Transition from reset state to active state]

FIG. 8 shows an example of a transition from a reset state to an active state.

When the device 20 enters a state where it is physically connected to a host from a reset state (where the device 20 is physically disconnected from the host 10), the device 20 is in a dormant state S_d1.

In the dormant state (time t0 to t1) S_d1, the transmission lines 30, 31, and 32 are in a non-active state (EIDL). For example, if the transmission lines 30, 31, and 32 each have a signal line pair (lane+ and lane−) as a differential pair, the signal line pair (lane+ and lane−) in the dormant state S_d1 are, for example, both set to a ground voltage Vss.

Firstly, the host 10 outputs STBL signal to the data transmission line 31 in order to instruct the device 20 to transit (change) to an active state S_active. The host 10 outputs a reference clock RCLK to the reference clock transmission line 30.

STBL signal is a DC level signal in which a low level voltage is applied to a positive signal line (lane+) of the data transmission line 31 and a high level voltage is applied to a negative signal line (lane−) of the data transmission line 31. That is, STBL signal means a strobe (STB) signal by which a low level voltage is applied to lane+ and the voltage of signal line pair (lane+ and lane−) does not change timewise.

The device 20, upon detecting STBL signals, transits (path B of FIG. 7) to a link check state (time t1 to t2) S_link to check each of the establishment of the synchronization of the inner clock CLK0 and the establishment of the synchronization of the inner clock CLK1 before transition to an active state. The link check state S_link also is referred to as a handshake check state to check whether or not data transfer of transmission/reception data becomes possible between the host 10 and the device 20.

The device 20 outputs, after confirmation of the establishment of the synchronization of the inner clock CLK0, a STBL signal (a response for handshake) to the data transmission line 32. The host 10 can confirm the establishment of the synchronization of the inner clock CLK0 in she device 20 by checking the STBL signal transmitted from the device 20 through the data transmission line 32.

The host 10 outputs, after confirming a handshake of STBL signals, that is, the establishment of the synchronization of the inner clock CLK0, SYN signals to the data transmission line 31.

SYN signals are, for example, AC level signals in which a voltage of signal line pair (lane+ and lane−) of the data transmission line 31 changes timewise between a high level and a low level. SYN signals are synchronous signals used for establishing the synchronization of the inner clock CLK1 in order to perform the data transfer of transmission/reception data.

When the device 20 confirms that the synchronization of the inner clock CLK1 is established using the SYN signals, the device 20 outputs SYN signals (a response for handshake) to the data transmission line 32. The host 10 can confirm the completion of the establishment of the synchronization of the inner clock CLK1 in the device 20 by checking SYN signals transmitted from the device 20 through the data transmission line 32.

When the host 10 confirms the completion of the establishment of the synchronization of the inner clocks CLK0 and CLK1 in the device 20, the device 20 enters an active state S_active in which the data transfer of transmission/reception data (packet data) PKT becomes possible between the host 10 and the device 20 (path C of FIG. 7).

[Transition Between Active State and Dormant State]

FIG. 9 shows an example of a transition between an active state and a dormant state.

In the FIG. 9, A, B, C, D, A', and D' correspond to paths A, B, C, D, A', and D' of a state machine of FIG. 7.

In the interface system of FIGS. 1 to 6, the device 20 enters, if a certain condition is satisfied, a power saving mode (dormant state) from a normal operation mode (active state) in order to reduce power consumption in the system. A certain condition is, for example, a case where data transfer of transmission/reception data is not performed between the host 10 and the device 20 for a certain period of time.

When a certain condition is satisfied, the device 20 enters the power saving mode, and therein, whether or not a certain condition is satisfied may be determined by the host 10 or the device 20. In a case where the host 10 determines that a certain condition is satisfied, the host 10 transmits a command to change the mode of the device 20 to the power saving mode to the device 20 through, for example, a data transmission line D0.

An important point here is, in the interface system of the present embodiment, there are two types of dormant state as described above. One is a dormant state S_d0 of FIG. 7 and the other is a dormant state of FIG. 7.

The dormant state S_d0 is a dormant state in which a reference clock RCLK is supplied to the PLL circuit 24 and the PLL circuit 24 is in an operating state, and corresponds to a low power mode of UHS-II standard (different from a dormant state in UHS-II standard). The dormant state S_d1 is a dormant state in which a reference clock RCLK is not supplied to the PLL circuit 24 and the PLL circuit 24 is in a non-operating state, and corresponds to a dormant state of UHS-II standard (in UHS-II standard, there is only one dormant state).

Furthermore, an important point in the interface system of the present invention is that there are two types of paths to return to an active state S_active from a dormant state S_d1. One is a direct return path to an active state S_active from a dormant state S_d1 (path D of FIG. 7), and the other is a path to return to an active state S_active from a dormant state S_d1 through a link check state S_link (path B to C of FIG. 7).

Path D returns to an active state S_active from a dormant state S_d1 without passing a link check state S_link even when a reference clock RCLK is not supplied to the PLL circuit 24 and the PLL circuit 24 is in a non-operating state, and in this respect, path D is significant in the interface system of FIGS. 1 to 6.

Such a return is achievable because, as described above with reference to FIGS. 1 to 6, the PLL circuit 24 can establish the synchronization of the inner clock CLK0 within a certain period of time after the device 20 confirms a return to an active state, that is, the PLL circuit 24 can lock the frequency of the inner clock CLK0 within a certain period of time after the device 20 confirms a return to an active state. Furthermore, since the CDR circuit 25 generates the inner clock CLK1 using the control voltage V0 of the PLL circuit 24, the CDR circuit 25 can establish the synchronization of the inner clock CLK1, that is, lock the frequency of the inner clock CLK1 within the certain period of time.

That is, in the interface system of FIGS. 1 to 6, the synchronization of each of the inner clocks CLK0 and CLK1 is securely established within the certain period of time, a direct return from the dormant state S_d1 to the active state S_active is achievable without performing a link check, that is, a handshake check between the host 10 and the device 20.

Note that path B to C corresponds to an ordinary return path to an active state S_active from a dormant state S_d1 in UHS-II standard.

In summary, as shown in FIG. 9, in the interface system of FIGS. 1 to 6, there are recovery modes of three types M0, M1, and M2.

Selection of the modes is performed by, for example, adding a flag QR to designate recovery mode M0, M1, or M2 in an instruction command to enter a power saving mode if the host 10 instructs the device 20 to enter the power saving mode. Here, since there are recovery modes of three types M0, M1, and M2, the flag QR is two bits.

For example, if the flag QR is 01, recovery mode M0 is selected. In that case, the device 20 enters a dormant state S_d0 from an active state S_active (path A'), and then, directly returns to an active state S_active from the dormant state S_d0 (path D').

Furthermore, if the flag QR is 10, recovery mode M1 is selected. In that case, the device 20 enters a dormant state S_d1 from an active state S_active (path A), and then, directly returns to an active state S_active from the dormant state S_d1 (path D).

Furthermore, if the flag QR is 11, recovery mode M2 is selected. In that case, the device 20 enters a dormant state S_d1 from an active state S_active (path A), and then, returns to an active state S_active from the dormant state S_d1 through a link check state S_link (path B to C).

[Transition from active state to dormant state]

Figure 10A:
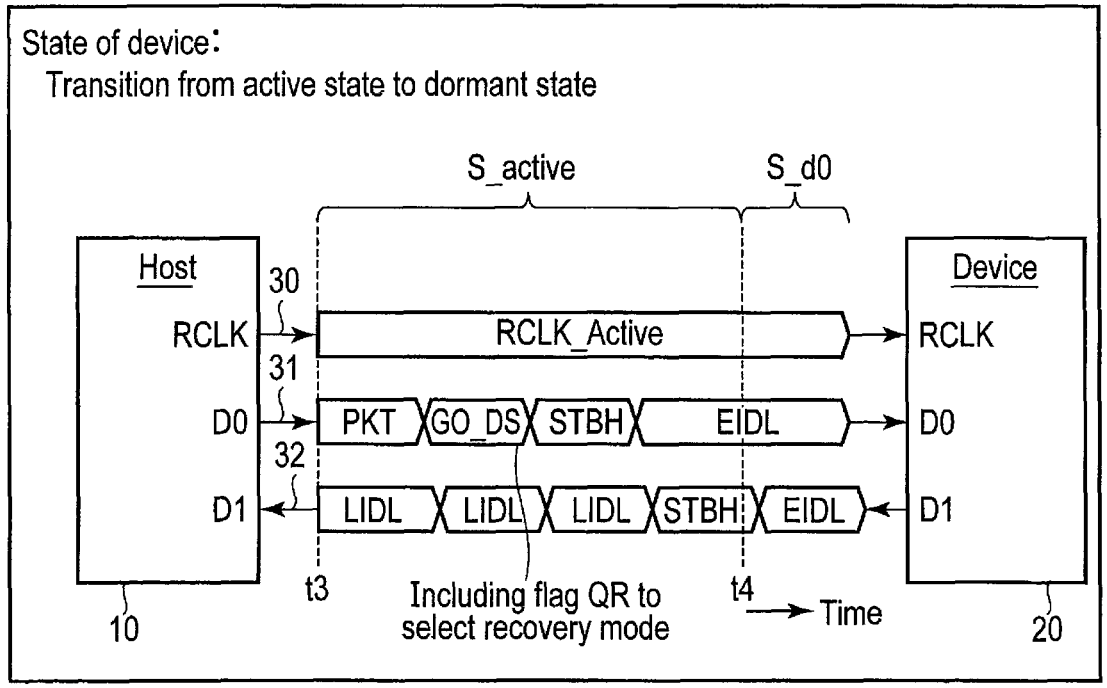
FIG. 10A is a view showing an example of a transition from an active state to a dormant state.
Figure 10B:
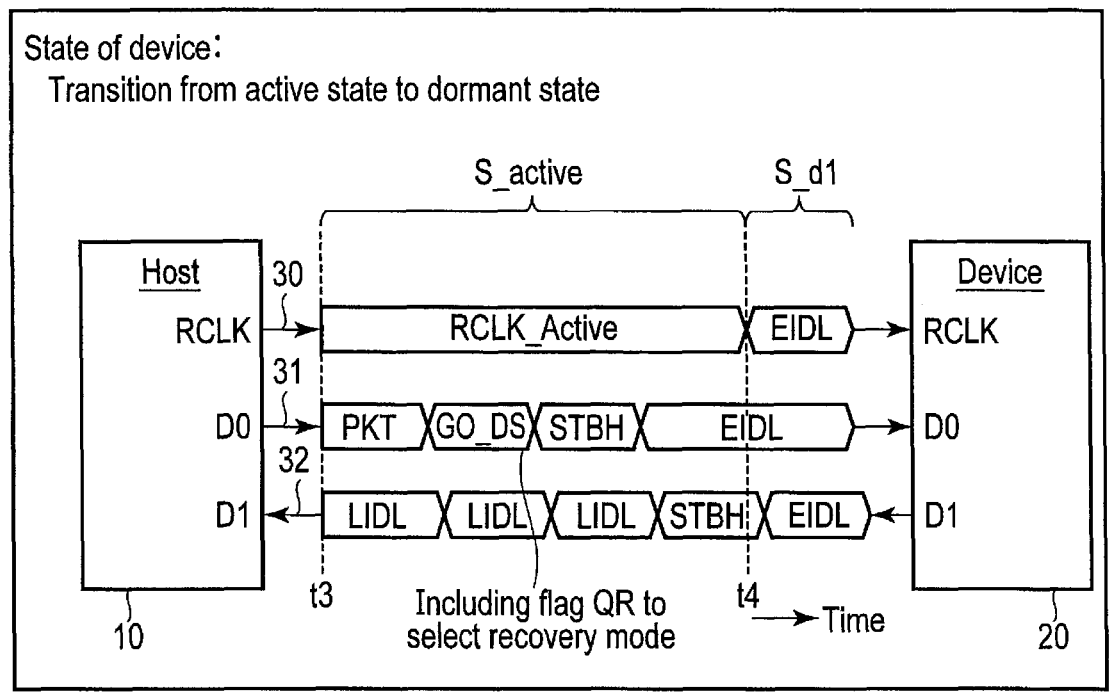
FIG. 10B is a view showing an example of a transition from an active state to a dormant state.

FIGS. 10A and 10B show an example of a transition from an active state to a dormant state.

If the device 20 is in an active state (time t3 to t4) S_active, the transmission lines 30, 31, and 32 are all in an active state. The reference clock RCLK is transmitted to the device 20 from the host 10 through the reference clock transmission line 30. The transmission/reception data (packet data) PKT are transferred between the host 10 and the device 20 through the data transmission lines 31 and 32.

In the active state S_active, the host 10 outputs a command GO_DS to the data transmission line 31 in order to instruct the device 20 to enter a dormant state S_d0 or S_d1. Subsequently, the host 10 outputs a STBH signal to the data transmission line 31.

The command GO_DS instructs a transition to the dormant state S_d0 or S_d1, and includes a flag QR to select one of recovery modes M0, M1, and M2. The selection of recovery modes M0, M1, and M2 can be performed by, for example, power management as shown in FIG. 11.

Figure 11:
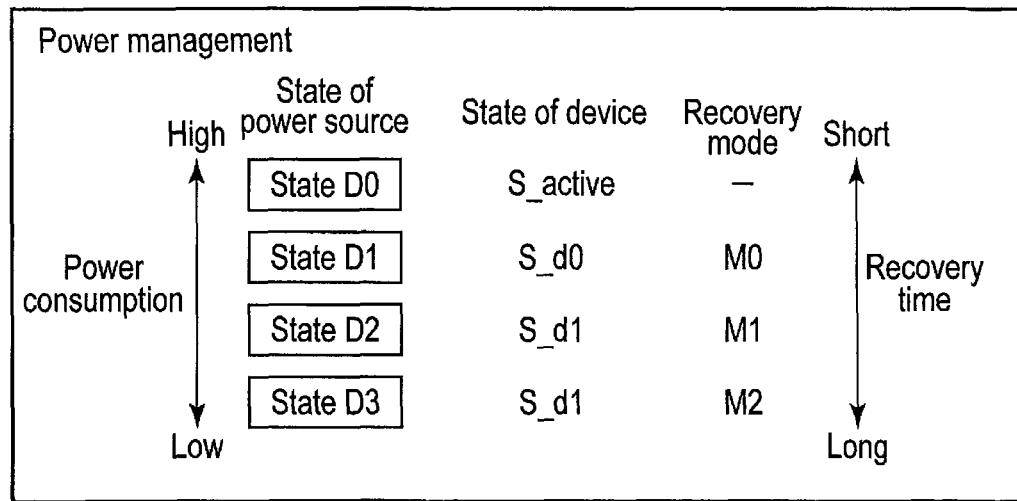
FIG. 11 is a view showing an example of a relationship between power management and recovery mode.

In an example of FIG. 11, four kinds of power states of the interface system exist.

D0 state is, for example, a state where all of the power sources of the interface system are curried on, and corresponds to an active state S_active. D1 state is, for example, a state where the power sources of the interface system are partly turned off, and corresponds to a dormant state S_d0. D2 state is, for example, a state where the power sources of the interface system are partly turned off, and corresponds to a dormant state S_d1. D3 state is, for example, a state where the power sources of the interface system are partly or entirely turned off, and corresponds to a dormant state S_d1.

The power consumption of the interface system gradually decreases from D0 state to D3 state. In comparison, a recovery time required to return to an active state S_active from a dormant state S_d0 or S_d1 gradually increases from D0 state to D3 state. That is, the power consumption and the recovery time are in a tradeoff relationship.

In consideration of the tradeoff, for example, an operating system (OS) used in the host 10 selects, in order to change the state of the device 20 to a dormant state S_d0 or S_d1, an optimal mode from the recovery modes M0, M1, and M2 using the power consumption and recovery time as parameters. Furthermore, the operating system associates, for example, the recovery mode M0 with D1 state, recovery mode M1 with D0 state, and recovery mode M2 with D3 state.

Here, a difference between recovery mode M1 and recovery mode M2 will be explained.

The recovery mode M1 is selected if a change of the data transmission rate (range) of transmission/reception data is not performed. In that case, a control voltage by which the output frequency of the PLL circuit and the CDR circuit is locked does not change significantly. Thus, with the high speed PLL circuit 24 and the high speed CDR circuit 25 as shown in FIGS. 3 and 4, a recovery within a certain period of time is possible, and recovery mode M1 can be selected.

The recovery mode M2 is selected if a change of the data transmission rate (range) of transmission/reception data is performed. That is, in the interface system of FIGS. 1 to 6, the output frequency (data transmission rate) of the PLL circuit and the CDR circuit may be changed in some cases, and therein, a control voltage by which the output frequency of the PLL circuit and the CDR circuit is locked is changed significantly. Thus, a recovery to an active state within a certain period of time is not possible, and recovery mode M2 is selected.

STBH signal is a DC level signal in which a high level voltage is applied to a positive signal line (lane+) of the data transmission line 31 and a low level voltage is applied to a negative signal line (lane−) of the data transmission line 31. That is, STBH signal means a strobe (STB) signal by which a high level voltage is applied to lane+ and the voltage of signal line pair (lane+ and lane−) does not change timewise.

The device 20, upon receiving the command GO_DS and subsequently detecting STBH signal, enters a dormant state S_d0 or S_d1 (path A or A' of FIG. 7). Furthermore, the device 20 outputs, after detecting STBH signal, STBH signal (a response indicating the reception of STBH signal from the host 10) to the data transmission line 32. The host 10 can confirm the transition of the device 20 into a dormant state S_d0 or S_d1 by checking STBH signal transmitted from the device 20 through the data transmission line 32.

Note that LIDL is a signal to maintain the synchronization of the data transfer using the data transmission line 32. Furthermore, the device 20 may output, after receiving the command GO_DS, the command GO_DS (a response indicating the reception of the command GO_DS) to the data transmission line 32.

Here, in the transition to a dormant state S_d0 (FIG. 10A), the host 10 keeps outputting the reference clock RCLK to the reference clock transmission line 30. On the other hand, in the transition to a dormant state S_d1 (FIG. 10B), the host 10 stops supplying of the reference clock RCLK to the device 20.

That is, in the dormant state S_d0, the reference clock transmission line 30 is in an active state, and the data transmission lines 31 and 32 are an a non-active state (EIDL). The signal line pairs (lane+ and lane−) of each of the transmission lines 31 and 32 in a non-active state are both set to a ground voltage Vss.

Furthermore, in the dormant state S_d1, the reference clock transmission line 30 and data transmission lines 31 and 32 are all in a non-active state (EIDL). The signal line pairs (lane+ and lane−) of each of the transmission lines 30, 31, and 32 in a non-active state are all set to a ground voltage Vss.

[Transition from Dormant State to Active State (Mode M0)]

Figure 12:
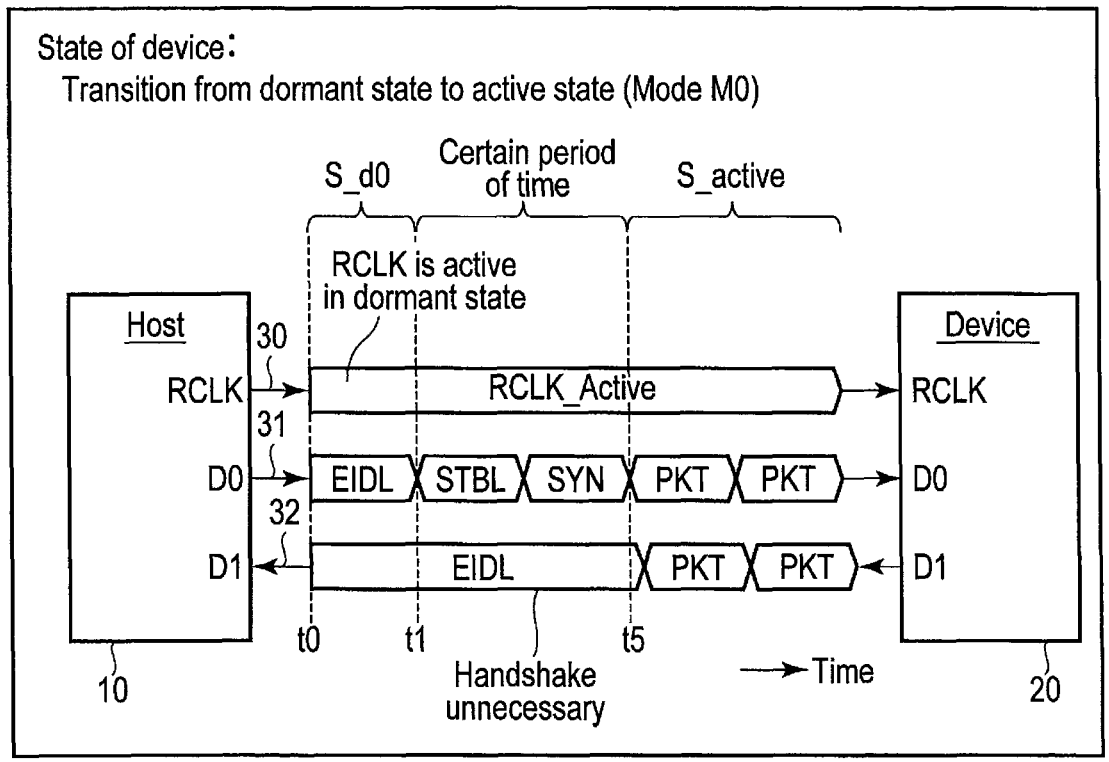
FIG. 12 is a view showing an example of recovery to an active state in mode M0.

FIG. 12 shows an example of a return to an active state in mode M0.

In a dormant state (time t0 to t1) S_d0, the reference clock transmission line 30 is in an active state (RCLK_Active), and the reference clock RCLK is supplied to the device 20. On the other hand, the data transmission lines 31 and 32 are in a non-active state (EIDL).

Firstly, the host 10 outputs STBL signal to the data transmission line 31 in order to instruct the device 20 to transit (change) to an active state S_active. Subsequently, the host 10 outputs SYN signal to the data transmission line 31. The device 20 transits (changes) to an active state S_active immediately after detecting STBL signal and SYN signal (path D' of FIG. 7).

Here, STBL signal and SYN signal define a certain period of time (time t1 to t5) from the instruction to the device 20 to transit (change) to an active state S_active to the locking of the PLL circuit and the CDR circuit (until the inner clocks CLK0 and CLK1 are synchronized).

That is, in mode M0, a handshake check to check whether or not data transfer of transmission/reception data becomes possible is not performed between the host 10 and the device 20. This is because, as described above, the reference clock RCLK is supplied and the PLL circuit is in an operating state in a dormant state S_d0, and a certain period of time required until the PLL circuit and the CDR circuit are locked, that is, until the synchronization of each of the inner clocks CLK0 and CLK1 is established is short and steady.

Thus, the device 20 transits to an active state S_active in which data transfer of transmission/reception data (packet data) PKT between the host 10 and the device 20 becomes possible after a certain period of time after confirming a transition to the active state S_active without performing a handshake check.

[Transition from Dormant State to Active State (Mode M1)]

Figure 13:
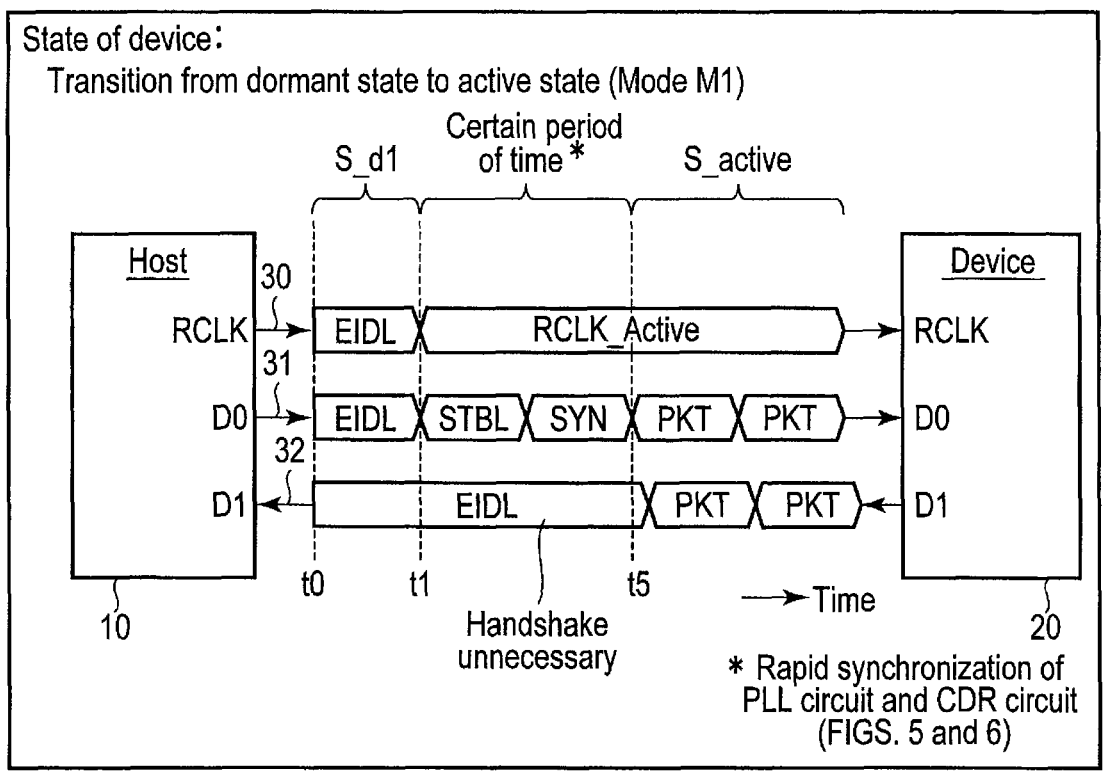
FIG. 13 is a view showing an example of recovery to an active state in mode M1.

FIG. 13 shows an example of a return to an active state in mode M1.

In a dormant state (time t0 to t1) the transmission lines 30, 31, and 32 are in a non-active state (EIDL).

Firstly, the host 10 outputs STBL signal to the data transmission line 31 in order to instruct the device 20 to transit (change) to an active state S_active. Subsequently, the host 10 outputs SYN signal to the data transmission line 31. Furthermore, the host 10 outputs a reference clock RCLK to the reference clock transmission line 30.

The device 20 transits (changes) to an active state S_active immediately after detecting STBL signal and SYN signal (path D of FIG. 7).

Here, STBL signal and SYN signal define a certain period of time (time t1 to t5) from the instruction to the device 20 to transit (change) to an active state S_active to the locking of the PLL circuit and the CDR circuit (until the inner clocks CLK0 and CLK1 are synchronized).

That is, in mode M1, a handshake check to check whether or not data transfer of transmission/reception data becomes possible is not performed between the host 10 and the device 20 as well. This is because, as described above, with the high speed PLL circuit and the high speed CDR circuit, even if the reference clock RCLK is stopped in a dormant state S_d1, a certain period of time required until these PLL and CDR circuits are locked, that is, until the synchronization of each of the inner clocks CLK0 and CLK1 is established is short and steady.

Thus, the device 20 transits to an active state S_active in which data transfer of transmission/reception data (packet data) PKT between the host 10 and the device 20 becomes possible after a certain period of time after confirming a transition to the active state S_active without performing a handshake check.

In mode M1, as in mode M0, rapid recovery to an active state S_active is performable, and in addition thereto, since the reference clock RCLK is stopped in a dormant state S_d1, for example, power consumption of the interface system in a power saving mode can be reduced more effectively as compared to mode M0.

[Transition from Dormant State to Active State (Mode M2)]

FIG. 14 shows an example of a return to an active state in mode M2.

In a dormant state (time t0 to t1) S_d1, the transmission lines 30, 31, and 32 are in a non-active state (EIDL).

Firstly, the host 10 outputs STBL signal to the data transmission line 31 in order to instruct the device 20 to transit (change) to an active state S_active. Furthermore, the host 10 outputs a reference clock RCLK to the reference clock transmission line 30.

The device 20 transits, upon detection of STBL signal, to a link check state (time t1 to t6) S_link to check synchronization of the inner clock CLK0 and synchronization of the inner clock CLK1 before transiting to an active state (path B of FIG. 7). The link check state S_link is a handshake check state to check whether or not data transfer of transmission/reception data becomes possible between the host 10 and the device 20.

The device 20 outputs, after confirmation of the establishment of the synchronization of the inner clock CLK0, STBL signal (a response for handshake) to the data transmission line 32. The host 10 can confirm the establishment of the synchronization of the inner clock CLK0 in the device 20 by checking STBL signal transmitted from the device 20 through the data transmission line 32.

The host 10 outputs, after confirming a handshake of STBL signals, that is, the establishment of the synchronization of the inner clock CLK0, SYN signals to the data transmission line 31.

After the synchronization of the inner clock CLK1 is established using the SYN signals, the device 20 outputs SYN signals (a response for handshake) to the data transmission line 32. The host 10 can confirm the establishment of the synchronization of the inner clock CLK1 in the device 20 by checking SYN signals transmitted from the device 20 through the data transmission line 32.

The host 10 confirms the establishment of the synchronization of the inner clocks CLK0 and CLK1 in the device 20, and the device 20 transits to an active state S_active in which the data transfer of transmission/reception data (packet data) PKT becomes possible between the host 10 and the device 20 (path C of FIG. 7).

(Memory Card System)

Figure 15:
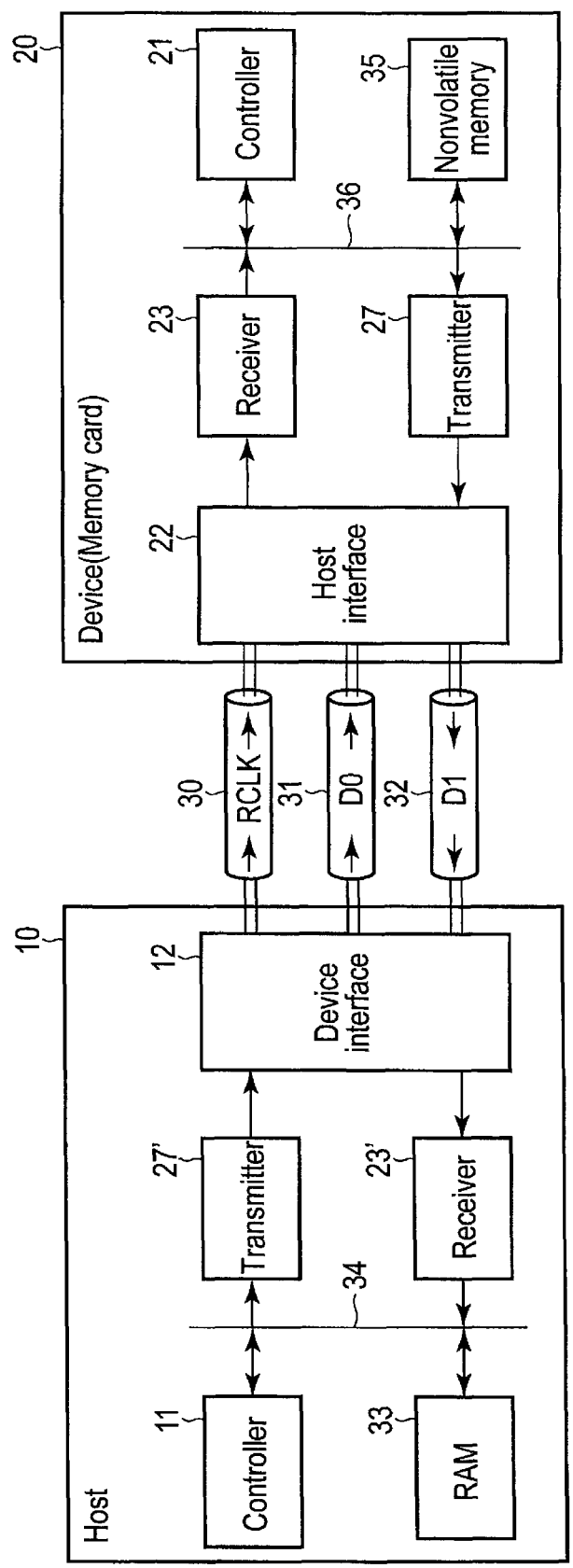
FIG. 15 is a diagram showing an example of application to a memory card system.

FIG. 15 shows an example of a memory card system to which the embodiment can be applied.

A host 10 and a device 20 are connected to each other through transmission lines (lane+ and lane−) 30, 31, and 32. The host 10 is an electronic device such as a personal computer, digital camera, smartphone, or tablet. The device 20 is a storage device such as a memory card.

The host 10 includes a device interface 12, transmitter 27', receiver 23', controller 11, random access memory (RAM) 33, and bus 34. If the host 10 has only a data transfer function, the receiver 23' in the host 10 can be omitted.

The device 20 includes a host interface 22, transmitter 27, receiver 23, controller 21, non-volatile memory 35, and bus 36. The nonvolatile memory 35 is, for example, a NAND flash memory. The nonvolatile memory may include memory cells of two-dimensional structure or memory cells of three-dimensional structure.

The interface system of FIGS. 1 to 6 is applied to, for example, the host interface 22 in the device 20. Thus, power consumed by the device 20 can be reduced and rapid recovery of the device 20 from a dormant state to an active state is possible.

(Conclusion)

As can be understood from the above, in the present embodiment, a new mode in which the supply of a reference clock is stopped when the device transits (changes) to a dormant state, and a handshake between the host and device is omitted when the device returns to an active state is added, and thus, an interface system in which a standby power is minimized and a rapid recovery is possible can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory card connectable to a host, the memory card comprising:

a host interface including a receiver and a first clock generator, the receiver being configured to receive a first clock and serial data from the host, the first clock generator including a first voltage controlled oscillator (VCO) and configured to generate a second clock on the basis of the first clock; and a controller configured to manage a state of the memory card, the state of the memory card including a first state and a second state, wherein the first clock and the serial data are supplied to the receiver in the first state and are not supplied to the receiver in the second state, and in the first state, the first clock generator is in an operating state, in the second state, the first clock generator is in a non-operating state, the controller is further configured to, in a first recovery mode, start receiving data or transmitting data from or to the host after a certain period of time after confirming a transition from the second state to the first state, without performing a handshake check.

2. The memory card of claim 1, wherein the host interface further includes a second clock generator and a sampling circuit, the second clock generator including a second voltage controlled oscillator (VCO) and configured to generate a third clock on the basis of the serial data, the sampling circuit configured to sample reception data on the basis of the third clock and the serial data, in the first state, the second clock generator is in an operating state, in the second state, the second clock generator is in a non-operating state, the controller is further configured to, in the first recovery mode, start sampling of the reception data or transmitting of data to the host after the certain period of time after confirming the transition from the second state to the first state, without performing the handshake check.

3. The memory card of claim 2, wherein the controller is further configured to transfer a response indicative of establishment of synchronization of the second and third clocks to the host through the host interface and then start sampling of the reception data or transmitting of the transmission data to the host, when confirming a transition from the second state to the first state in a second recovery mode.

4. The memory card of claim 3, wherein the state of the memory card further includes a third state, in the third state, the first clock generator is in an operating state and the second clock generator is in a non-operating state, the controller is further configured to, in a third recovery mode, start sampling of the reception data or transmitting of the transmission data to the host after a certain period of time after confirming a transition from the third state to the first state, and not transmit a response indicative of establishment of synchronization of the second and third clocks to the host.

5. The memory card of claim 4, wherein the controller is further configured to confirm a transition from the second state to the first state, or a transition from the third state to the first state, on the basis of a command from the host.

6. The memory card of claim 5, wherein the command includes a flag which selects one of the first, second, and third recovery modes.

7. The memory card of claim 6, wherein the controller is further configured to set the first and second clock generators to the first state in a normal operation mode, and set the first and second clock generators to the second or third state in a power saving mode, and power consumption of the second state is less than power consumption of the third state.

8. The memory card of claim 2, wherein frequency of the second clock and frequency of the third clock are locked in the certain period of time.

9. The memory card of claim 1, wherein the first clock generator includes a memory unit configured to store an initial control voltage of the first voltage controlled oscillator (VCO).

10. The memory card of claim 9, wherein the memory unit stores a control voltage of the first voltage controlled oscillator (VCO) as the initial control voltage when frequency of the second clock is locked in the first state before the first recovery mode, and applies the initial control voltage to the first voltage controlled oscillator (VCO) in the first recovery mode.

11. The memory card of claim 10, wherein a data transmission rate of the reception data or the transmission data in the first state before the first recovery mode is substantially the same as a data transmission rate of the reception data or the transmission data in the first state after the first recovery mode.

12. The memory card of claim 1, wherein
the controller is further configured to confirm a transition from the second state to the first state, on the basis of a command from the host.

13. The memory card of claim 3, wherein
the controller is further configured to confirm a transition from the second state to the first state, on the basis of a command from the host.

* * * * *